United States Patent
Barnes et al.

[11] Patent Number: 5,241,245
[45] Date of Patent: Aug. 31, 1993

[54] OPTIMIZED HELICAL RESONATOR FOR PLASMA PROCESSING

[75] Inventors: Michael S. Barnes, Mahopac; Dennis K. Coultas, Hopewell Junction, both of N.Y.; John G. Forster, Poughkeepsie, N.J.; John H. Keller, Newburgh, N.Y.

[73] Assignee: International Business Machines Corporation, Armonk, N.Y.

[21] Appl. No.: 879,663

[22] Filed: May 6, 1992

[51] Int. Cl.⁵ .............................................. H01J 7/24
[52] U.S. Cl. ......................... 315/111.41; 315/111.51; 315/111.61; 315/111.71; 156/643; 118/623
[58] Field of Search ............... 315/5, 39, 39.3, 111.21, 315/111.31, 111.41, 111.51, 111.61, 111.71, 111.81, 111.91; 156/272.6, 643, 901, 902, DIG. 111; 118/50.1, 623

[56] References Cited
U.S. PATENT DOCUMENTS

| | | | |
|---|---|---|---|
| 3,873,884 | 3/1975 | Gabriel | 315/267 |
| 4,368,092 | 1/1983 | Steinberg et al. | 156/345 |
| 4,918,031 | 4/1990 | Flamm et al. | 437/225 |
| 4,948,458 | 8/1990 | Ogle | 156/646 X |

FOREIGN PATENT DOCUMENTS 0379828 12/1989 European Pat. Off. .

OTHER PUBLICATIONS

The Radio Amateur's Handbook, American Radio Relay League, 54th Edition, 1977; pp. 293–294.
William Sinnema, Electronic Transmission Technology, Prentice-Hall, Inc., 1979 pp. 54–62.

Primary Examiner—David Mis
Attorney, Agent, or Firm—Whitham & Marhoefer

[57] ABSTRACT

An optimized helical resonator which increases the plasma density for efficient processing of semiconductor wafers is characterized by a low inductance and, hence, a low Q. A first embodiment uses either a distributed or lumped capacitance to reduce the value of $\omega L$ to less than about 200 Ohms. A second embodiment uses a flat spiral coil having a low value of $\omega L$ and resonant as a ¼ or ½ wave resonator. A third embodiment combines features of the first two embodiments using both spiral and solenoid coils as the helical resonator.

8 Claims, 4 Drawing Sheets

OPTIMIZED HELICAL RESONATOR FOR PLASMA PROCESSING

CROSS-REFERENCE TO RELATED APPLICATION

The invention disclosed in this application is related to that of U.S. patent application Ser. No. 07/301,933 filed Jan. 25, 1989, by D. K. Coultas and J. H. Keller and assigned to the assignee of this application. The subject matter of that application is incorporated herein by reference.

BACKGROUND OF THE INVENTION

1. Field of the Invention

The present invention generally relates to plasma processing of semiconductor wafers in the manufacture of integrated circuits (ICs) and, more particularly, to a plasma processing device using an optimized helical resonator to achieve efficient processing.

2. Description of the Prior Art

Plasma processing is an indispensable technology in the manufacture of very large scale integrated (VLSI) circuits. Plasma-assisted etching techniques have replaced chemical etching, and sputtering has replaced evaporation for the deposition of metals. Plasma enhanced chemical vapor deposition (PECVD) is an alternative to conventional and low pressure CVD techniques. In a reactive ion etcher (RIE), for example, silicon wafers are loaded on a radio frequency (RF) powered electrode and the chamber is grounded. In typical sputtering and PECVD devices, the wafers are loaded onto a revolving turntable in the chamber.

A number of schemes have been used to generate the plasma used for processing the wafers, including magnetrons and capacitive devices. More recently, helical resonators (i.e., inductors) have been used to generate the plasma. An example is disclosed, for example, in U.S. Pat. No. 4,368,092 to Steinberg et al. This device uses a downstream, high Q helical resonator to produce the plasma that is introduced to the reaction chamber. A disadvantage of the Steinberg et al. device is that it is radially asymmetric resulting in nonuniformities of the etching of the workpiece. U.S. Pat. No. 4,918,031 to Flamm et al. discloses another example of a high Q, helical resonator wherein, in one embodiment, the substrates are held within the resonator, thus avoiding the nonuniformities produced by the Steinberg et al. device. However, because of the high Q, the source efficiency is low, and wall sputtering of the source is increased, leading to damage to the chamber and particulate generation.

The ratio of the reactance (inductive or capacitive) of a circuit to the series resistance of the circuit is called the Q (for quality factor) of the circuit. Helical resonators for producing plasmas are typically high Q devices with an unloaded Q (i.e., plasma attenuated) of about 1000. These devices are capable of producing large voltages and can produce plasmas at low pressures. However, these same properties can cause them to operate in a capacitively coupled mode instead of an inductive mode. Capacitive coupling is much less efficient than inductive coupling for generating high plasma densities at low pressures (e.g., 1-20 mTorr).

SUMMARY OF THE INVENTION

It is therefore an object of the present invention to provide an optimized helical resonator to increase the source efficiency and plasma density for more efficient processing of semiconductor wafers.

According to a first embodiment of the invention, an optimized configuration is used for generating a down stream plasma. This embodiment of the invention uses a lumped capacitance to reduce the value of $\omega L$ to less than about 200 Ohms. The value of the lumped capacitance is determined by taking into account the stray capacitance between the coil and the grounded enclosure. A second embodiment of the invention is an optimized configuration for single wafer high plasma density reactive ion etching (RIE). This embodiment uses a flat spiral coil having a low value of $\omega L$ and resonant as a ¼ or ½ wave resonator. On the ¼ wave resonator, one side of the coil is grounded and the other is at a high voltage. On the ½ wave resonator, both sides of the coil are grounded and the center of the coil is at a high voltage. The third embodiment of the invention combines features of the first two embodiments using both spiral and solenoid coils as the helical resonator.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
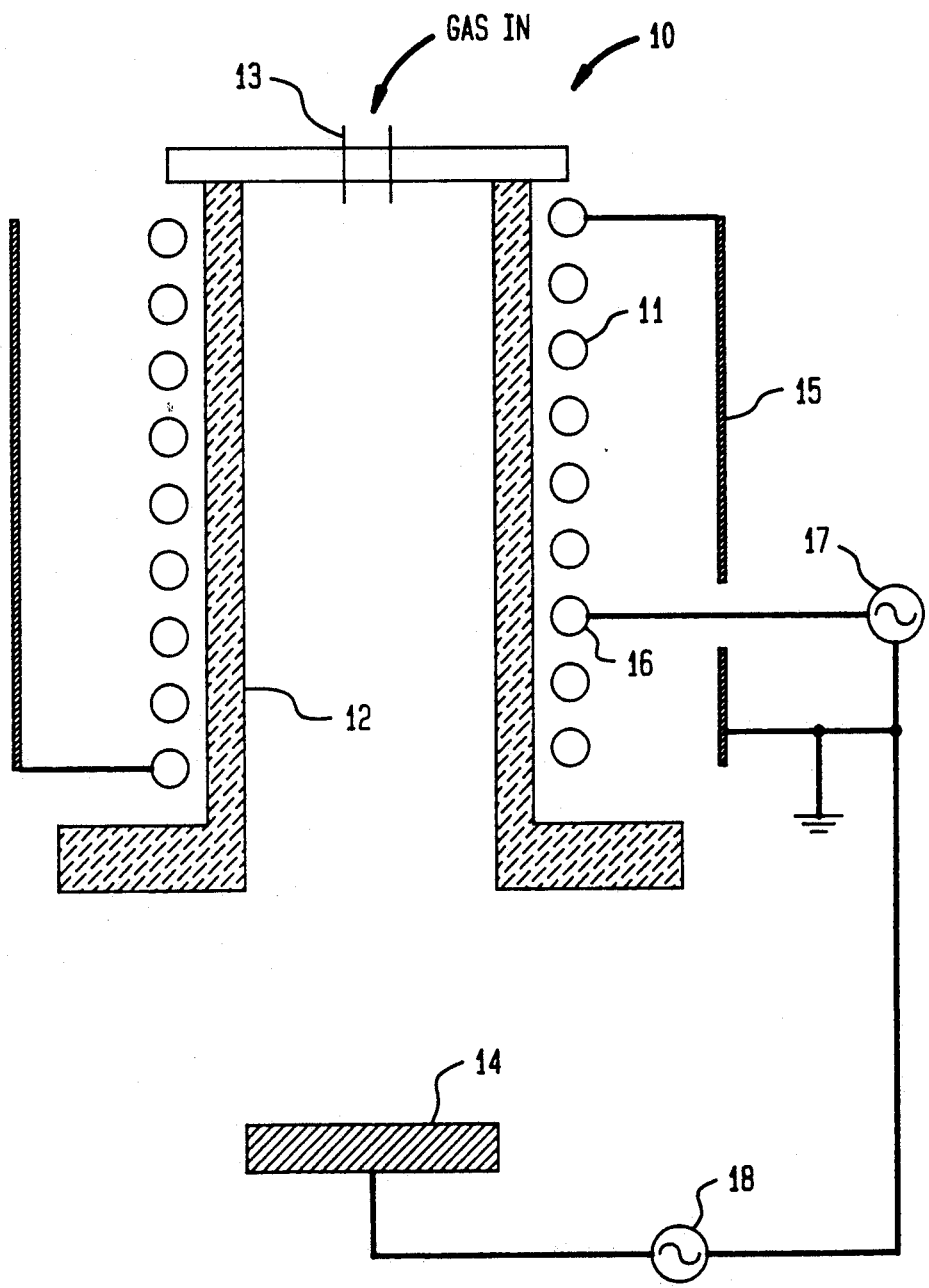
FIG. 1 is a cross-sectional view of a conventional helical resonator characterized by a high Q.

Referring now to the drawings, and more particularly to FIG. 1, there is shown a conventional high Q helical resonator 10 comprising an inductive coil 11 wound about a gas discharge tube 12. At the upper end of the gas discharge tube 12, there is a gas inlet 13 for admitting a plasma forming gas. At the lower or discharge end of the tube 12 is an electrode 14 for supporting a semiconductor wafer to be processed. The ends of the coil 11 are connected to a ground shield 15, shown schematically in the FIG. 1. A tap 16 on coil 11 is connected to a first RF source 17. The tap location is adjusted to provide optimum impedance matching between the RF source 17 and the helical resonator. The wafer supporting electrode 14 can be biased by a second RF source 18, as is a common practice in high density plasma processing. The RF source 17 dominantly controls the plasma density, while the RF source 18 mainly controls the ion energy.

The typical Q for the conventional helical resonator shown in FIG. 1 is on the order of 1000. The unloaded coil resistances are typically about 0.1 Ohm. When the plasma is on, the resistance increases to about one Ohm, dropping the Q by a factor of ten. The problem with the high Q helical resonator of the prior art shown in FIG. 1 is that the large inductance associated with standard helical ¼ or ½ wave resonators produces a large voltage across the coil 11. This, in turn, produces a capacitive coupling of the power to the plasma inside the reactor chamber 12. As a result, the source will operate at reduced efficiency due to the drop in current in the coil 11 limiting power inductively coupled to the plasma.

The inventors have shown that for dominantly inductive coupling, the power in the discharge is proportional to the square of the coil current minus a constant A, i.e., $P_{ind} \propto I^2 - A$, where A is defined by the following expression:

$$A \propto \frac{\text{(Plasma Resistance)} \times \text{(Inductive Power)}}{L_c \times L_{plasma} \times \omega^2 \times k^2},$$

where $L_c$ is the coil inductance, $L_{plasma}$ is the plasma inductance, k is the coupling coefficient between the plasma and the coil, and $\omega$ is $2\pi f$, the applied frequency. For dominantly capacitive coupling, the power into the plasma is proportional to the square of the voltage V on the electrode or coil, i.e., $P_{cap} \propto V^2$, where $V^2 = \omega^2 L_c^2 I^2$. If $I^2 \approx A$, then $P_{cap}$ becomes $$P_{cap} \approx \frac{L_c}{k^2 L_{plasma}}.$$

With capacitive coupling, most of the power into the discharge goes into ion bombardment of the electrodes. Thus, to get high density plasmas, the capacitive coupling and $L_c$ could be reduced. This implies lower Q operation of a helical resonator for achieving high density plasmas. High density plasmas are needed in single wafer etching in order to achieve reasonable process times. In addition, the reduced inductance $L_c$ can be used in conjunction with multi-pole magnets to confine the plasma and further increase its density. In addition, magnets may be inside or outside the coil to confine the plasma. The basic structure of a single wafer plasma processing tool is disclosed in the above-referenced application Ser. No. 07/301,933.

Figure 2:
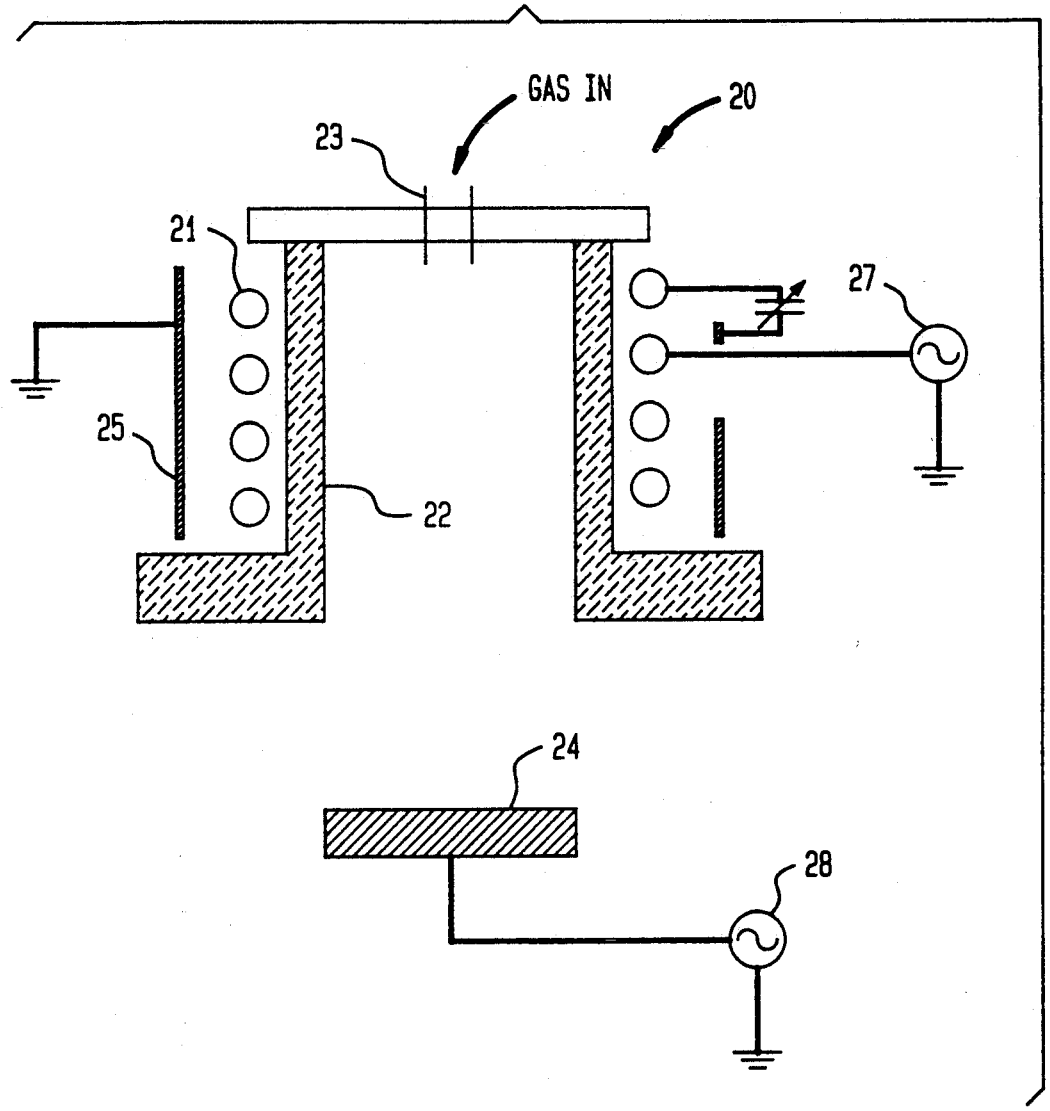
FIG. 2 is a cross-sectional view of a first embodiment of the optimized helical resonator according to the invention.

Referring now to FIG. 2, there is shown a first embodiment of the present invention. In FIG. 2, there is shown a low Q helical resonator 20 comprising an inductive coil 21 wound about a gas discharge tube 22. At the upper end of the gas discharge tube 22, there is a gas inlet 23 for admitting a plasma forming gas, and at the lower or discharge end of the tube 22 in an electrode 24 for supporting a semiconductor wafer to be processed. One end of the coil 21 is connected to ground shield 25, shown schematically in FIG. 2. The ground shield 25, and hence one end of the coil 21, is connected to ground. A tap 26 on coil 21 is connected to a first RF source 27, while the electrode 24 on which a semiconductor wafer is loaded is connected to a second RF source 28. If desired, RF sources 27 and 28 may include matching networks, as is common for RF sources. In addition, a variable capacitor 29 is connected between the ungrounded end (i.e., the "hot" end) of coil 21 and the ground shield 25.

In this optimized helical resonator, the number of turns of the coil 21 is significantly less than the number of turns typically used in the high Q coil 11 shown in FIG. 1. As a result, the inductance is less resulting in a Q preferably in the range of 150 to 200. As in the conventional helical resonator, when the plasma is on, the resistive load increases to about one Ohm. However, in the case of the optimized helical resonator, the Q drops to about 15 to 20 in contrast to 100 for the conventional helical resonator. The capacitor 29 is adjustable to permit tuning the system to be resonant at the operating frequency.

Figure 3:
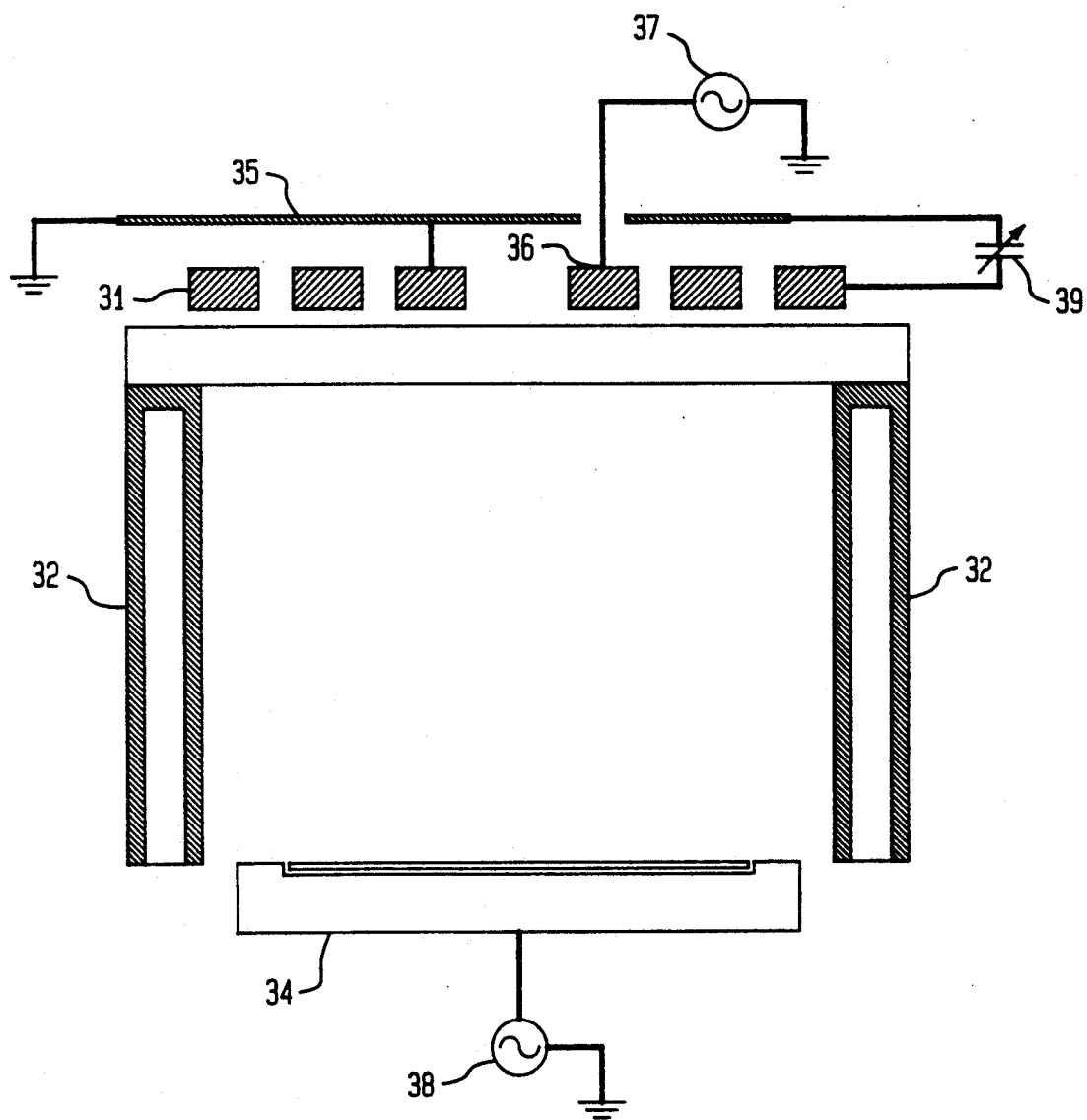
FIG. 3 is a cross-sectional view of a second embodiment of the optimized helical resonator according to the invention.

A second embodiment of the invention is shown in FIG. 3. In this embodiment, the coil 31 is in the form of a flat spiral having its interior end connected to the ground shield 35. A tap 36 of the coil 31 is connected to a first RF source 37, and a second RF source 38 is connected to the electrode 34. A capacitor 39 is connected between the ungrounded end of coil 31 and ground. In this embodiment, magnetic confinement of the plasma is accomplished by means of multi-dipole magnets 32 arranged about the periphery of the reaction chamber, in the classic magnetic confinement cylindrical arrangement. That is, magnetic fields of the magnets 32 are directed inwardly and alternate in polarity.

Figure 4:
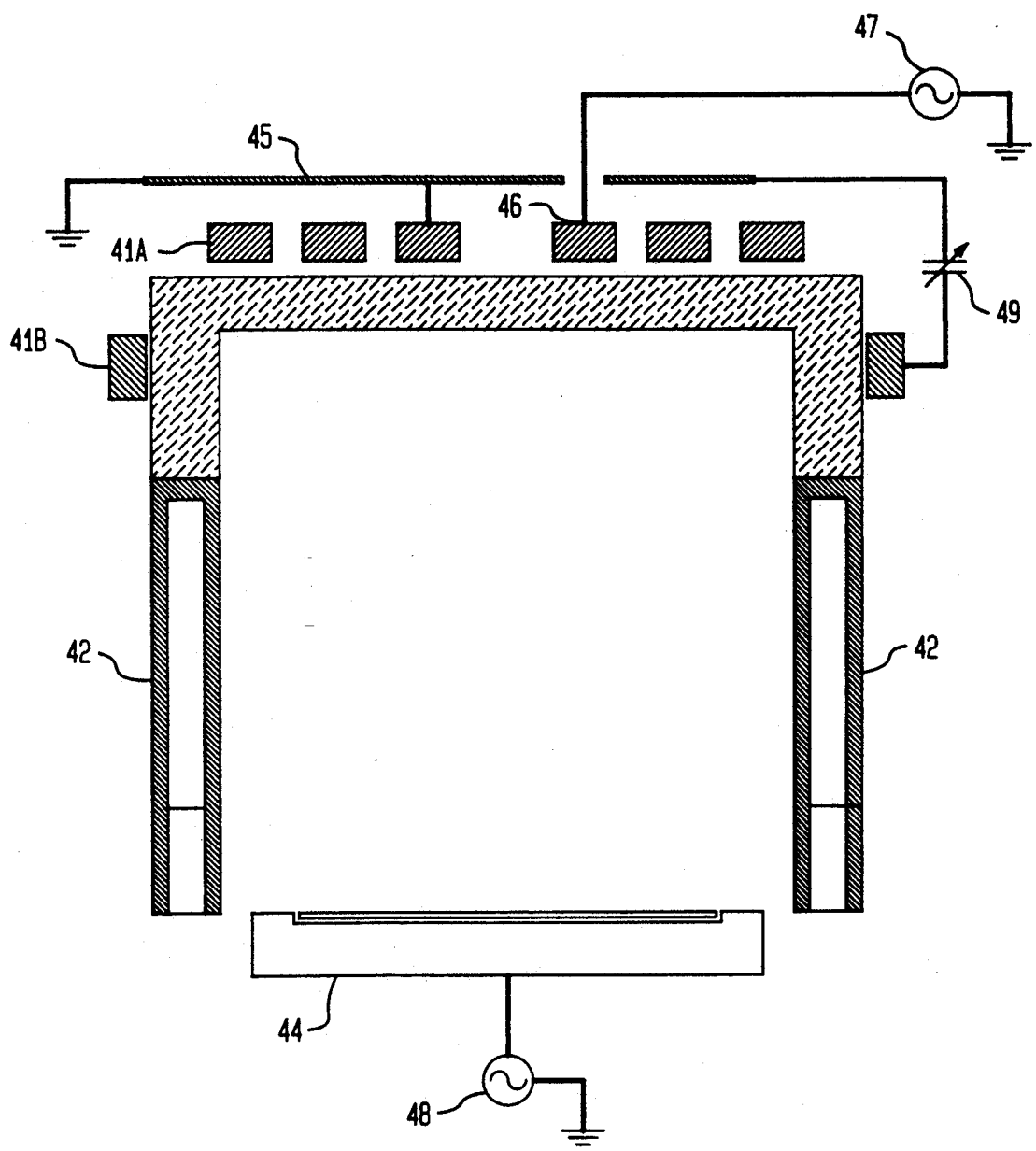
FIG. 4 is a cross-sectional view of a third embodiment of the optimized helical resonator according to the invention.

The third embodiment of the invention, shown in FIG. 4, combines features of the first two embodiments. More particularly, the coil 41 is formed of a flat spiral part 41A and a solenoid part 41B. As in the second embodiment shown in FIG. 3, the flat spiral part 41A has its interior end connected to a ground shield 45. A tap 46 of the coil 41 is connected to a first RF source 47, and a second RF source 48 is connected to the electrode 44. The tap 46 is shown on the flat spiral part 41A of the coil, but it will be understood that the tap could be on the solenoid part 41B depending on the specific design, the principle criteria being to provide a good impedance match with the RF source 47. A capacitor 49 is connected between the ungrounded end of coil 41 and ground. Magnets 42 are used for magnetic field confinement of the plasma, as in the embodiment of FIG. 3.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A resonator for a plasma processing system comprising:
   a plasma reaction chamber having a wall and adapted to contain within said wall at least one work piece having a surface to be processed in a plasma;
   a gas discharge tube through which a plasma supporting gas is admitted to said reaction chamber;
   a radio frequency helical coil proximate said wall of said plasma reaction chamber for generating a magnetic field for supporting a plasma within said reaction chamber, said coil having a low Q less than about 400;
   a ground shield adjacent said radio frequency coil, at least one end of said coil being connected to said ground shield;
   a radio frequency source connected to a first tap on said coil for supplying radio frequency power to said coil; and
   a variable capacitor connected between a second tap on said coil and said ground shield for adjusting the resonance of the structure including said coil.

2. The resonator recited in claim 1 wherein said helical coil is in the form of a solenoid.

3. A resonator for a plasma processing system comprising:
   a plasma reaction chamber having a wall and adapted to contain within said wall at least one work piece having a surface to be processed in a plasma;

a gas discharge tube through which a plasma supporting gas is admitted to said reaction chamber;

a radio frequency helical coil in the form of a flat spiral adjacent said plasma reaction chamber for generating a magnetic field for supporting a plasma within said reaction chamber;

a ground shield adjacent said radio frequency coil, at least one end of said coil being connected to said ground shield;

a radio frequency source connected to a first tap on said coil for supplying radio frequency power to said coil; and a variable capacitor connected between a second tap on said coil and said ground shield for adjusting the resonance of the structure including said coil.

4. The resonator recited in claim 3 wherein said coil has a low Q less than about 400.

5. The resonator recited in claim 3 further comprising a plurality of multi-dipole magnets arranged about said reaction chamber, magnetic fields of said plurality of magnets being directed inwardly of said reaction chamber and alternating in polarity to magnetically confine a plasma in said reaction chamber.

6. A resonator for a plasma processing system comprising:

a plasma reaction chamber having a wall and adapted to contain within said wall at least one work piece having a surface to be processed in a plasma;

a gas discharge tube through which a plasma supporting gas is admitted to said reaction chamber;

a radio frequency helical coil in the form of a combination of a solenoid section and a flat spiral section adjacent said plasma reaction chamber for generating a magnetic field for supporting a plasma within said reaction chamber;

a ground shield adjacent said radio frequency coil, at least one end of said coil being connected to said ground shield;

a radio frequency source connected to a first tap on said coil for supplying radio frequency power to said coil; and a variable capacitor connected between a second tap on said coil and said ground shield for adjusting the resonance of the structure including said coil.

7. The resonator recited in claim 6 wherein said coil has a low Q less than about 400.

8. The resonator recited in claim 6 further comprising a plurality of multi-dipole magnets arranged about said reaction chamber, magnetic fields of said plurality of magnets being directed inwardly of said reaction chamber and alternating in polarity to magnetically confine a plasma in said reaction chamber.

* * * * *